(12) United States Patent
Bogner

(10) Patent No.: US 7,095,346 B2
(45) Date of Patent: Aug. 22, 2006

(54) A/D CONVERTER WITH MINIMIZED TRANSFER ERROR

(75) Inventor: Peter Bogner, Villach (AT)

(73) Assignee: Infineon Technologies AG, Munich (DE)

( * ) Notice: Subject to any disclaimer, the term of this patent is extended or adjusted under 35 U.S.C. 154(b) by 176 days.

(21) Appl. No.: 10/973,656

(22) Filed: Oct. 26, 2004

(65) Prior Publication Data

US 2005/0116846 A1 Jun. 2, 2005

(30) Foreign Application Priority Data

Nov. 27, 2002 (DE) ................................ 102 55 354

(51) Int. Cl.
 *H03M 1/10* (2006.01)
(52) U.S. Cl. ....................... 341/120; 341/144; 341/145
(58) Field of Classification Search ................ 341/155, 341/144, 145, 156, 122, 118, 120, 172
See application file for complete search history.

(56) References Cited

U.S. PATENT DOCUMENTS

| | | | |
|---|---|---|---|
| 4,399,426 A | | 8/1983 | Tan |
| 5,861,828 A | * | 1/1999 | Opris ........................ 341/120 |
| 5,929,796 A | * | 7/1999 | Opris et al. .................. 341/120 |
| 6,191,715 B1 | * | 2/2001 | Fowers ........................ 341/120 |
| 6,400,302 B1 | * | 6/2002 | Amazeen et al. ........... 341/172 |
| 6,603,416 B1 | * | 8/2003 | Masenas et al. ............ 341/120 |
| 6,784,824 B1 | * | 8/2004 | Quinn ........................ 341/172 |

FOREIGN PATENT DOCUMENTS

| | | |
|---|---|---|
| DE | 101 33 538 A1 | 1/2003 |
| EP | 0 430 599 A2 | 6/1991 |
| EP | 0 550 990 A2 | 7/1993 |

* cited by examiner

*Primary Examiner*—John B Nguyen
(74) *Attorney, Agent, or Firm*—Maginot, Moore & Beck

(57) ABSTRACT

An A/D converter has at least one converter stage which, respectively, has a sample and hold circuit for sampling an analog input signal. The converter stage also includes a comparator unit that compares the analog input signal with a reference value in order to produce a digital output value from the converter stage, a digital/analog converter for converting the digital output value into an analog signal, a subtractor for subtracting the analog signal from the sampled input signal, a signal amplifier for amplifying the output signal which is output by the subtractor with a particularl singal gain factor for the next converter stage, and a weighting unit for multiplying the digital output value by a multiplier for addition to further weighted output values from converter stages to produce the digital output value from the A/D converter.

18 Claims, 5 Drawing Sheets

A/D CONVERTER WITH MINIMIZED TRANSFER ERROR

CROSS-REFERENCE TO RELATED APPLICATIONS

This application claims the benefit of German Patent Application 102 55 354.8 filed Nov. 27, 2002.

FIELD OF THE INVENTION

The invention relates to an A/D converter, particularly a pipeline converter.

BACKGROUND

A/D converters are used for converting an analog input signal into a digital output signal. The A/D conversion is normally performed by comparing an unknown analog signal with a known reference value. For the A/D conversion, there are a series of different conversion methods in which either the analog signal is amplified, i.e. is multiplied by a prescribed weighting factor, or the reference signal is divided, i.e. is divided by a prescribed weighting factor.

FIG. 1 shows a three-stage pipeline converter with the stages A, B, C. Pipeline converters likewise compare the analog signal $a_{in}$ with the reference value, but the unknown analog signal $a_{in}$ is normally amplified two-fold and compared with a constant reference variable REF. The three-stage pipeline converter shown comprises a sample & hold stage $S/H_A$ which is used to sample and hold the analog input signal $a_{in}$. In addition, each of the three stages A-C comprises an amplifier $V_A$ (or a weighting unit) with a weighting or gain factor k=2, and a comparator $K_A$ which is used to compare the digitally converted analog input signal $a_{in}$ with a reference value REF. If the digitally converted analog signal $a_{in}$ is greater than the reference value REF, the reference value REF is deducted from the two-fold amplified analog signal $a_{in}$ at a subtraction node S, and the resultant difference value is moved on to the sample & hold stage $S/H_B$ in the next converter stage B. If, on the other hand, the analog signal $a_{in}$ is less than the prescribed reference value, the two-fold amplified analog signal $a_{in}$ $V_A$ is immediately moved on to the sample & hold stage $S/H_B$ in the converter stage B.

In the first case, the converter stage A generates a logic "1" digital value, and in the latter case it generates a logic "0" digital value. In this way, each of the stages A-C generates one bit (D/b) which together produce a digital, binary code which may be between 0 and $2^n-1$, where n is the number of converter stages. In this case, the bit weight of the digital conversion result is equal to 2 on account of the weighting or gain factor 2 of the amplifiers V.

While a successive approximation converter requires n cycles before the conversion result is definite, and only then is it possible to start a new conversion again, the conversion result in the pipeline converter as shown in FIG. 1 is admittedly also not valid until after n cycles, but the next analog value to be converted can be moved into the pipeline after just the first cycle in stage A.

The accuracy of the two converter types is definitively determined by the accuracy of the division or multiplication factor k=2 which is used to multiply or divide the analog signal or the reference value. When weighting with a numeric base of two, the accuracy of the factor 2, which arises in the division factor ½, ¼, ⅛ etc. in the case of the SA converter and in the multiplication factor 2 in the case of the pipeline converter, is of particular importance. An error in one of these weighting factors has an immediate effect on the digital end results, as the following example shows:

A DA converter with a resolution of 8 bits is capable of quantizing an unknown analog signal or a reference variable into $2^8=255$ levels. The A/D converter now has an analog signal applied to it which corresponds to a quantization level with the decimal value 128. This analog value is now compared with a reference value which has been generated by dividing a prescribed reference variable (the prescribed reference variable is multiplied by a factor of ⅜, for example). With correct division, this would result in a reference value which corresponds to a quantization level of 127, for example, and which is less than the analog value 128. On account of an inaccuracy in the division factor (⅜), however, the comparison with the reference value which corresponds to a decimal value of 128 and 129 also gives the result that the analog value is greater than the reference value. Since the reference value for the quantization levels is incorrectly less than the analog value, the result which is output for the comparison is a "1" instead of a "0".

Besides the inaccuracy in the weightings carried out by the converters (division, multiplication), the accuracy of the A/D converters is affected by transient signal voltages. The inputs and outputs of the amplifiers V, of the comparators K and of the subtraction nodes S normally have transient signals applied to them which have overshoots, for example, and decay to a constant value only after a particular decay time.

In an n-bit converter, n decisions need to be made in order to obtain a digital n-bit word, each of these decisions needing to be at least as accurate as a quantization level in the final digital conversion result. The speed at which comparisons and other operations can be performed in an n-bit converter is determined by the dynamic response of the signals to be processed in the converter. In the case of an SA converter, a relatively large amount of time is needed in order to generate the necessary reference values with the desired accuracy using the digital controller and the DA converter. In the case of the pipeline converter shown in FIG. 1, some time is needed before the amplifiers V have reached a steady state. If the operations performed by the A/D converter are performed too early, errors may therefore arise.

In order to reduce the frequency of error and hence to increase the accuracy of the A/D converters, it is already known practice to use A/D converters with redundant code. A/D converters with redundant code are distinguished in that a reference value, such as ¾ of a prescribed reference variable, with which the unknown analog signal is compared does not form the limit of the value range for a subsequent comparison, but rather, depending on the result of the comparison, a smaller or larger value is used. This will be explained in more detail below using an example.

An 8-bit converter quantizing an analog signal into values of between 0 and 255 has an analog signal supplied to it whose analog value corresponds to a decimal, quantized value of 128. In a comparison in stage n, this analog value is compared with a reference value which corresponds to a quantization level with the decimal value 127. This establishes that the reference value is less than the analog value. So as now to avoid errors on account of inaccurate weighting or transient signal fluctuations, the next comparison, performed by the A/D converter, does not involve selection of the value range between 127 and 255, as usual, but rather involves selection of a value range between a smaller value, e.g. 120, and 255. This means that minor incorrect decisions can still be corrected later and do not affect the final conversion result.

In a conventional, binary converter, on the other hand, once a bit has been set incorrectly it cannot be corrected again in the subsequent conversion steps.

The error-preventing property of redundant A/D converters is achieved by virtue of the weighting factors, such as the gain factor $V_K$ of the amplifiers V or the division factor which the digital controller (weighting unit 4) uses to generate a reference value from a prescribed reference variable, are not based on a numeric base of 2, but rather are based on a smaller numeric base e.g. 1.8.

In an SA converter with redundant code, the reference elements used to divide the prescribed reference variable are then not twice as large, four times as large etc. (reference elements may be capacitors, current sources, resistors etc.), but rather are less than twice as large, four times as large etc. The reference elements may give rise, by way of example, to a bit weight for the digital output signal of 1; 1.8; $1.8^2$; $1.8^3$ etc. In the case of a pipeline converter as shown in FIG. 1, this means that the weighting or gain factor of the amplifiers would not need to be two but rather 1.8.

The difficulty with such redundant A/D converters is that the factor 1.8 cannot be generated as easily as the factor 2 by respectively doubling the reference element. As a result, errors are obtained which are already larger in principal than in a binary converter.

Each of the converter stages A, B, C delivers one bit digA, digB, digC of the digital conversion result as the result of the comparison performed by the stages. In the example shown in FIG. 1, a redundant code 1,0,0,0 is obtained. However, the digital conversion result is not binary, with a bit weight of 2, and therefore also does not correspond to the decimal number $2^3=8$, but rather is based on the base of 1.8 and thus corresponds to the number $1.8^3=5.832$. This result is calculated as $0 \cdot 1 + 0 \cdot 1.8^1 + 0 \cdot 1.8^2 + 1 \cdot 1.8^3 = 5.832$. The individual bits of the conversion result are added using the arrangement shown at the bottom in FIG. 1, which, for this purpose, has memories for storing multiplication factors MF, multiplying a plurality of storage elements SG and addition nodes AK. Finally, the code with a bit weight of 1.8 is used to generate a binary code. After the last addition node $AK_c$ (bottom far right), the binary code associated with the redundant code is obtained, that is to say the conversion result in binary form.

Errors in the binary conversion result arise particularly when the weightings $V_i$ for the analog signal or for the reference variable which are performed by the A/D converter does not correspond precisely to the stored multiplication factors, which is used when converting the redundant code into a binary code.

To date, attempts have been made to compensate for this error by altering the gains $V_1$ for the pipeline converter shown in FIG. 1 in the converter analog circuit. This is relatively complicated, however.

Hence, German Laid-Open Specification DE 101 33 538.5 A1 has proposed an A/D converter in which it is a simple matter to calibrate the multiplication factors $MF_i$.

This A/D converter based on the prior art, which is shown in FIG. 2, weights not only the analog signal to be converted or a reference variable but also an auxiliary signal PSR (Pseudo Random) in the A/D converter and at the same time has a calibration amplifier for weighting digital random signal PSR, whose gain factor can be altered. The weighting factor G applied by the A/D converter is ascertained by virtue of the random signal PSR weighted by the A/D converter and the auxiliary signal PSR (or signals derived therefrom) weighted by the controllable calibration amplifier and also the original (unweighted) random signal being supplied to an evaluation unit which performs correlation analysis.

FIG. 2 shows a converter stage A in a conventional pipeline converter with an associated calibration device KAL. The pipeline converter is an A/D converter with redundant code and comprises, in the normal way, an amplifier V with a weighting factor 2, a comparator K and a subtraction node S.

Next to the first converter stage A, FIG. 2 also shows a second converter stage B and a third converter stage C.

The sum of the PSR signal and the input signal is finally amplified by an amplifier $V_A$, e.g. a factor $VA=2$. The analog summed signal is also compared with a reference variable REF at the comparator. If the analog summed signal is greater than the reference variable REF, the reference variable is deducted from the two-fold amplified summed signal, and the resultant value is output to the next converter stage B. Otherwise, the two-fold amplified analog summed signal, comprising the analog input signal $a_{in}$ and the digital random signal, is forwarded to the next converter stage B immediately without subtracting the reference signal.

The calibrating device KAL comprises a controllable digital weighting unit or calibration amplifier and an evaluation unit.

The digital signal element generated in the pipeline converter is tapped off at the output of the converter stage B and is likewise supplied to the evaluation unit. The evaluation unit comprises a subtraction node SUB which is used to subtract the digital random signal PSR multiplied by the weighting factor G in the controllable digital weighting unit from the digitally converted analog signal. If the weighting factor GA in the controllable weighting unit and the gain factor VA in the amplifier match, the resultant difference signal DIF comprises only the uncorrelated quantization error plus the input signal. If the weighting factor and the gain $V_A$ do not match, a remainder of the digital random signal is also left over.

The difference signal DIF can be evaluated using a correlation unit $R_{xy}$, the correlation unit performing cross-correlation of the difference signal DIF with the original, digital random signal PSR. The result of the correlation is used to adjust the weighting factor GA in the controllable weighting unit G until the difference signal DIF no longer contains any remainder of the digital random signal.

In this case, the output of the correlation unit $R_{xy}$ is connected to the weighting unit via a low-pass filter TP, for example.

FIG. 3 shows a circuit implementation for a converter-stage in the pipeline analog/digital converter based on the prior art.

FIG. 3 shows a single-ended implementation for a two-bit digital/analog converter having four DAC capacitors C1 to C4. The DAC has a reference signal REF, a thermometer-coded comparator output signal and a sample control signal applied to it. During the sample phase, the analogue input signal $a_{in}$ is applied to the DAC capacitors C1 to C4. The converter stage also comprises a feedback operational amplifier having a feedback capacitor.

The pipeline analog/digital converter based on the prior art which is shown in FIG. 2 has the following drawbacks.

To feed the digital random signal to the analog/digital converter's signal path formed by the converter stages, an additional calibration digital/analog converter is necessary. This increases the circuit complexity for the analog/digital converter.

The converter stage based on the prior art which is shown in FIG. 3 comprises various DAC capacitors C1, C2, C3 and C4 which result in different DAC stages on account of production variations and manufacturing tolerances. To transfer from one DAC stage in the digital/analog converter to another DAC stage, a transfer error or DAC error is therefore obtained. This transfer error in the digital/analog converter is fed into the signal path and continues through the converter stages, so that the digital output value from the overall analog/digital converter is corrupted.

It is therefore the object of the present invention to provide an analog/digital converter in which the result corruptions on account of a transfer error are minimal.

SUMMARY

The invention provides an analog/digital converter for converting an analog input signal ($a_{IN}$) into a digital output value, having
  at least one converter stage which respectively has:
  a sample/hold circuit for sampling the analogue input signal,
  a comparator unit which compares the sampled analog input signal with a reference value in order to produce a digital output value from the converter stage,
  a digital/analog converter for converting the digital output value into an analog signal,
  a subtractor for subtracting the analog signal which is output by the digital/analog converter from the sampled input signal, and
  a signal amplifier for amplifying the output signal which is output by the subtractor with a particular signal gain for the next converter stage,
  a weighting unit for multiplying the digital output value by a multiplier for addition to further weighted output values from converter stages to produce a digital output value from the analog/digital converter;
  a random signal generator for generating a random signal which is fed into the converter stage;
  at least one calibration unit which respectively has:
  a calibration amplifier with an adjustable calibration gain factor for signal amplification for the random signal,
  an evaluation unit which correlates the random signal which is fed into the signal path and is amplified by the converter stage with the random signal amplified by the calibration amplifier in the calibration unit, in order to generate a setting signal for setting the calibration gain factor, such that the output of the correlation unit changes to zero and hence the calculated calibration gain factor corresponds to the gain which is brought about by the digital/analog converter and the signal amplifier in the converter stage,
  where the random signal generator applies the random signal, via a switch which can be controlled by the calibration unit, to a calibration capacitor ($C_{cal}$) within the digital/analog converter in the converter stage in order to feed it into the signal path, where
  the random signal can be connected to further DAC capacitors ($C_1$) within the digital/analog converter in order to calculate the respective signal gains of the DAC stages in the digital/analog converter, and
  the calibration unit uses the ascertained signal gains ($V_i$) in the DAC stages in the digital/analog converter to calculate the signal gain differences $\Delta V_{ij}$ between the DAC stages in order to calculate a transfer error (DAC error) for the digital/analog converter.

One advantage of the inventive analog/digital converter is that no additional calibration digital/analog converter is necessary, but rather the digital/analog converter already contained in the converter stage is used to feed in the digital random signals. This reduces the circuit complexity of the inventive analog/digital converter.

In one preferred embodiment of the inventive analog/digital converter, the calculated transfer error (DAC error) is deducted from the digital output value from the converter stages using a subtractor in order to compensate for errors.

In a further preferred embodiment, the calculated signal gains ($V_i$) are buffer-stored in registers in the calibration unit.

The calibration unit preferably calculates a mean value for the buffer-stored signal gains which are brought about by the DAC capacitors used (C1, C2, C3, C4).

This calculated mean value for the signal gains is preferably applied as a multiplier to the weighting unit in the converter stage by the calibration unit.

In one preferred embodiment, the calibration amplifier in the calibration unit has a subtraction circuit connected downstream of it which subtracts the signal amplified by the calibration amplifier from a signal derived from the signal path in the converter stages and outputs a difference signal to the evaluation unit.

The evaluation unit contained in the calibration unit preferably performs cross-correlation between the difference signal and the random signal.

The evaluation unit preferably has a filter connected downstream of it.

In one preferred embodiment, the calibration unit has a flow controller for generating control signals for actuating switches.

The output values from the comparator units are preferably thermometer-coded.

In one preferred embodiment of the inventive analog/digital converter, said analog/digital converter has at least two converter stages, for example five converter stages.

The analog/digital converter is preferably of fully differential design.

Preferred embodiments of the inventive analog/digital converter are described below with reference to the appended figures in order to explain features which are fundamental to the invention.

BRIEF DESCRIPTION OF THE DRAWINGS

In the figures.

DETAILED DESCRIPTION

Figure 4:
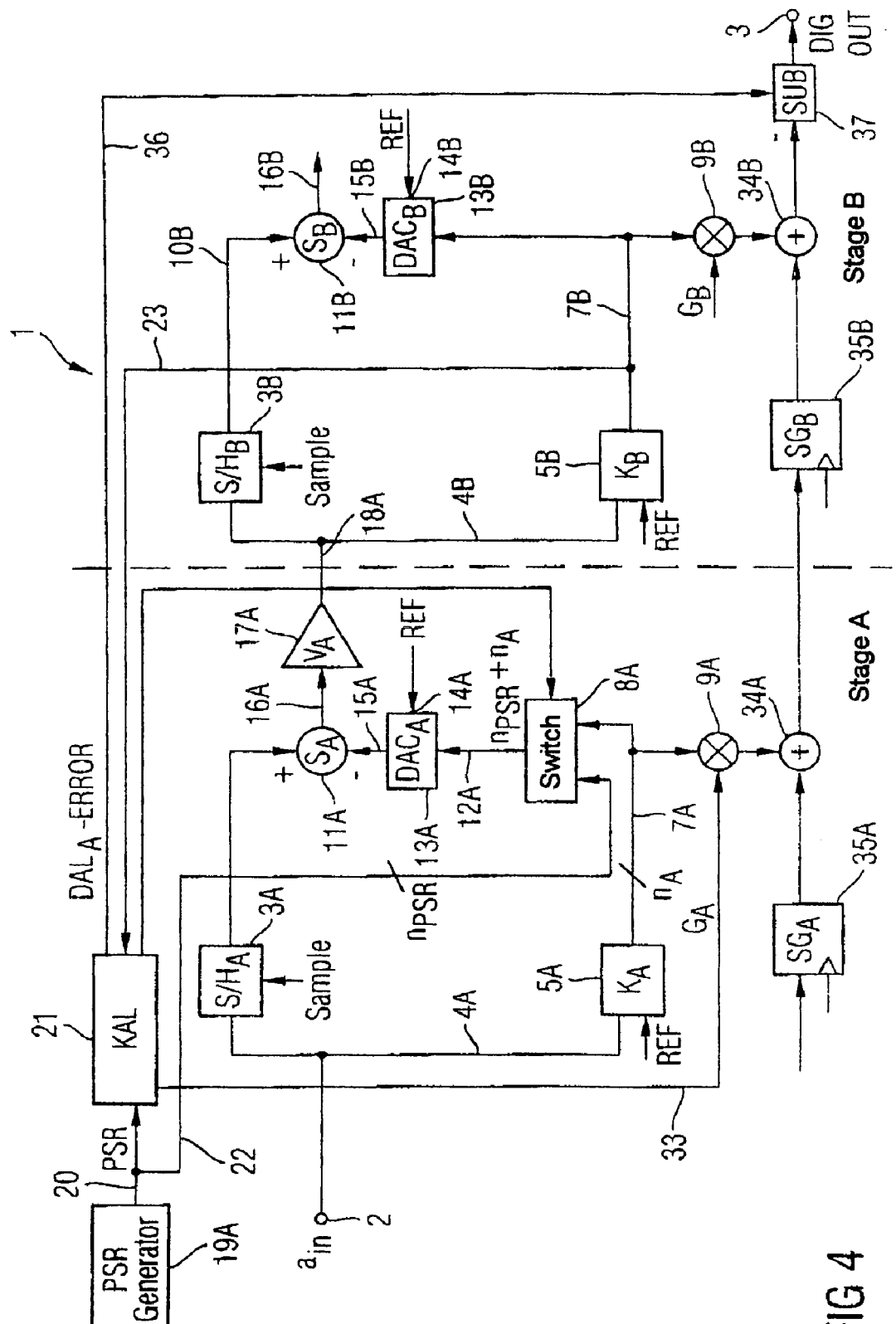
FIG. 4 shows a block diagram of a preferred embodiment of the inventive analogue/digital converter.

FIG. 4 shows a preferred embodiment of an analog/digital converter 1 based on the invention. In the example shown in FIG. 4, just two converter stages (stage A, stage B) are shown in order to simplify the illustration. The inventive analog/digital converter 1 preferably has at least two converter stages. In one possible embodiment, the inventive analog/digital converter 1 is provided with six converter stages.

The converter stages are connected in series with one another and form a signal path within the analog/digital converter 1. The analog/digital converter 1 based on the invention has an analog signal input 2 and a digital output 3. The analog input signal ($a_{in}$) applied to the signal input 2 is supplied to the first converter stage A. The converter stage A contains a sample & hold circuit 34 which is actuated by a sample control signal. The analog input signal $a_{in}$ is supplied to a comparator unit 5A via a line 4A, and said comparator unit compares the sampled analog input signal with the reference value REF in order to produce a digital output value from the converter stage A. The digital output value from the comparator unit 5A is supplied via at least one bit line 7A to a switching device 8A and a weighting unit 9A, provided in the converter stage A. The digital output value may be a single output bit, for example. The input signal sampled by the sample & hold circuit 3A is also supplied to a subtractor 11A via a line 10A. The output of the switch 8A is connected by means of lines 12A to a digital/analog converter 13A which converts the digital output value into an analog output signal. To this end, the digital/analog converter 13A receives a reference signal REF via an input 14A. The digital/analog converter 13A outputs the analog output signal produced to the subtractor 11A via a line 15A. The subtractor 11A subtracts the analog output signal produced by the digital/analog converter 13A from the sampled input signal and outputs the difference signal produced to a signal amplifier 17A via a line 16A. The signal amplifier 17A amplifies the difference signal which is output by the subtractor 11A with a particular signal gain VA. The output of the signal amplifier 17A is connected to a further sample/hold circuit 3B by means of a line 18A. The converter stage B connected downstream of the converter stage A is of the same design as the converter stage A.

Figure 1:
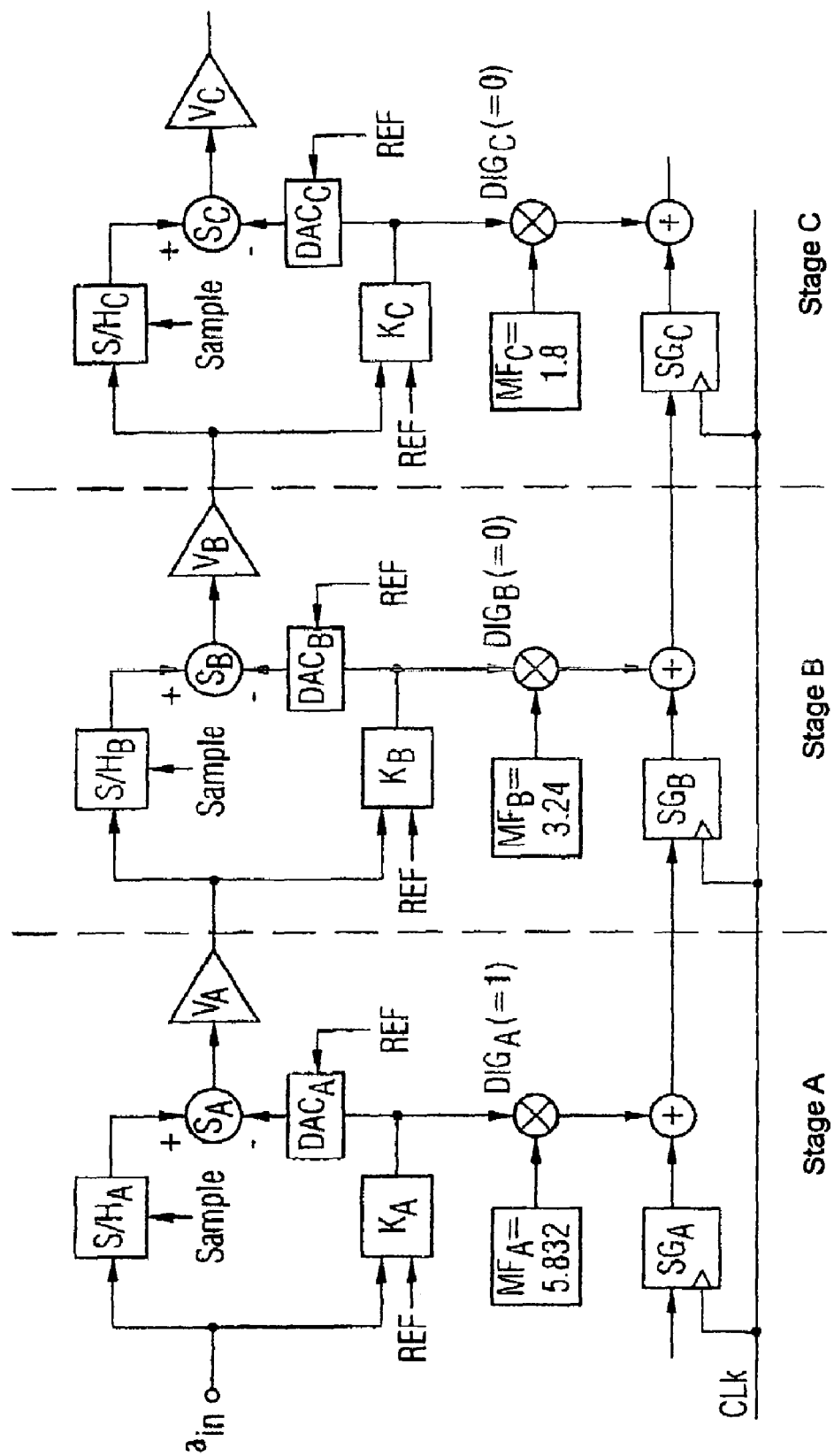
FIG. 1 shows a pipeline analog/digital converter based on the prior art.
Figure 2:
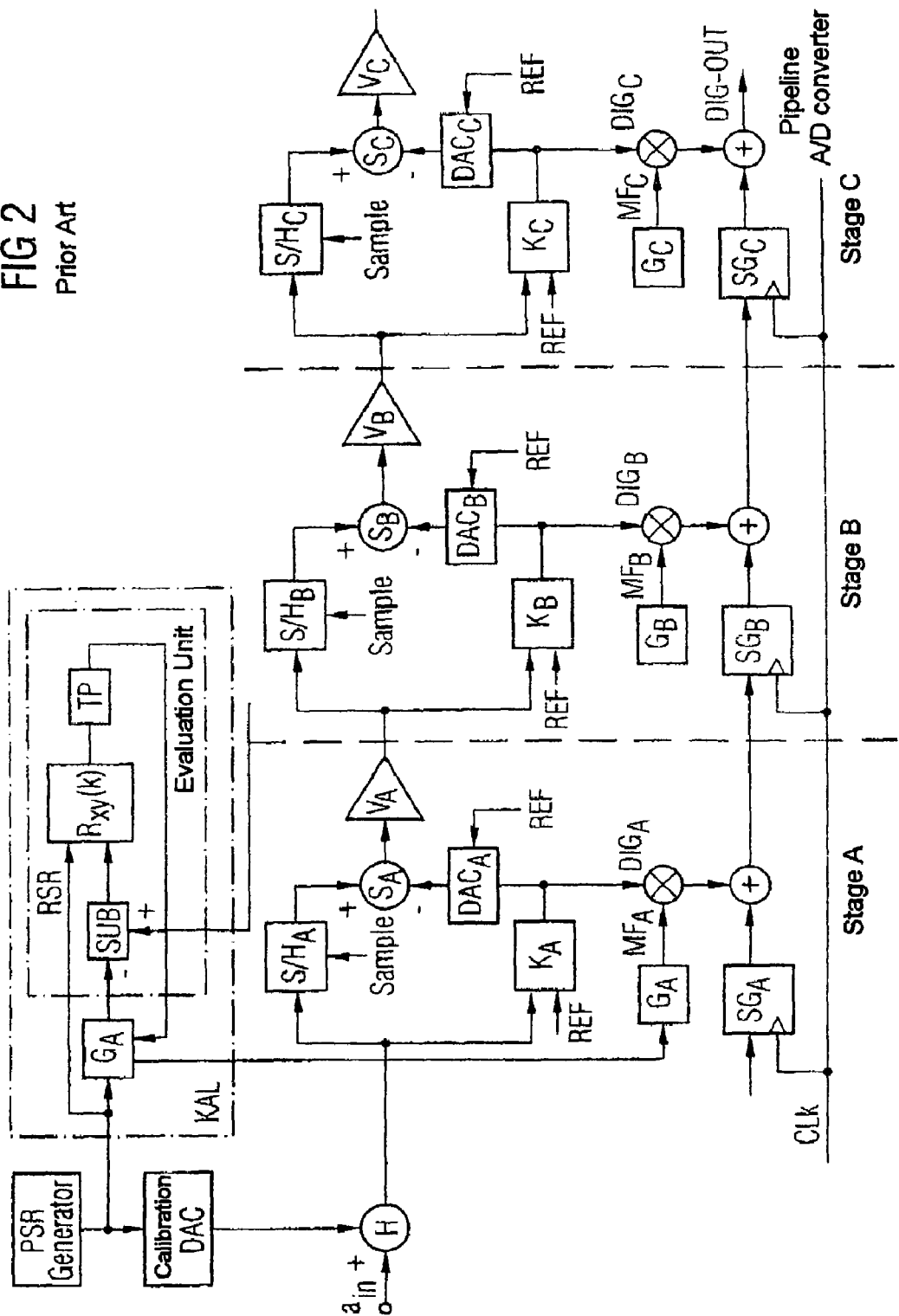
FIG. 2 shows a further pipeline analog/digital converter with a calibration unit based on the prior art.
Figure 3:
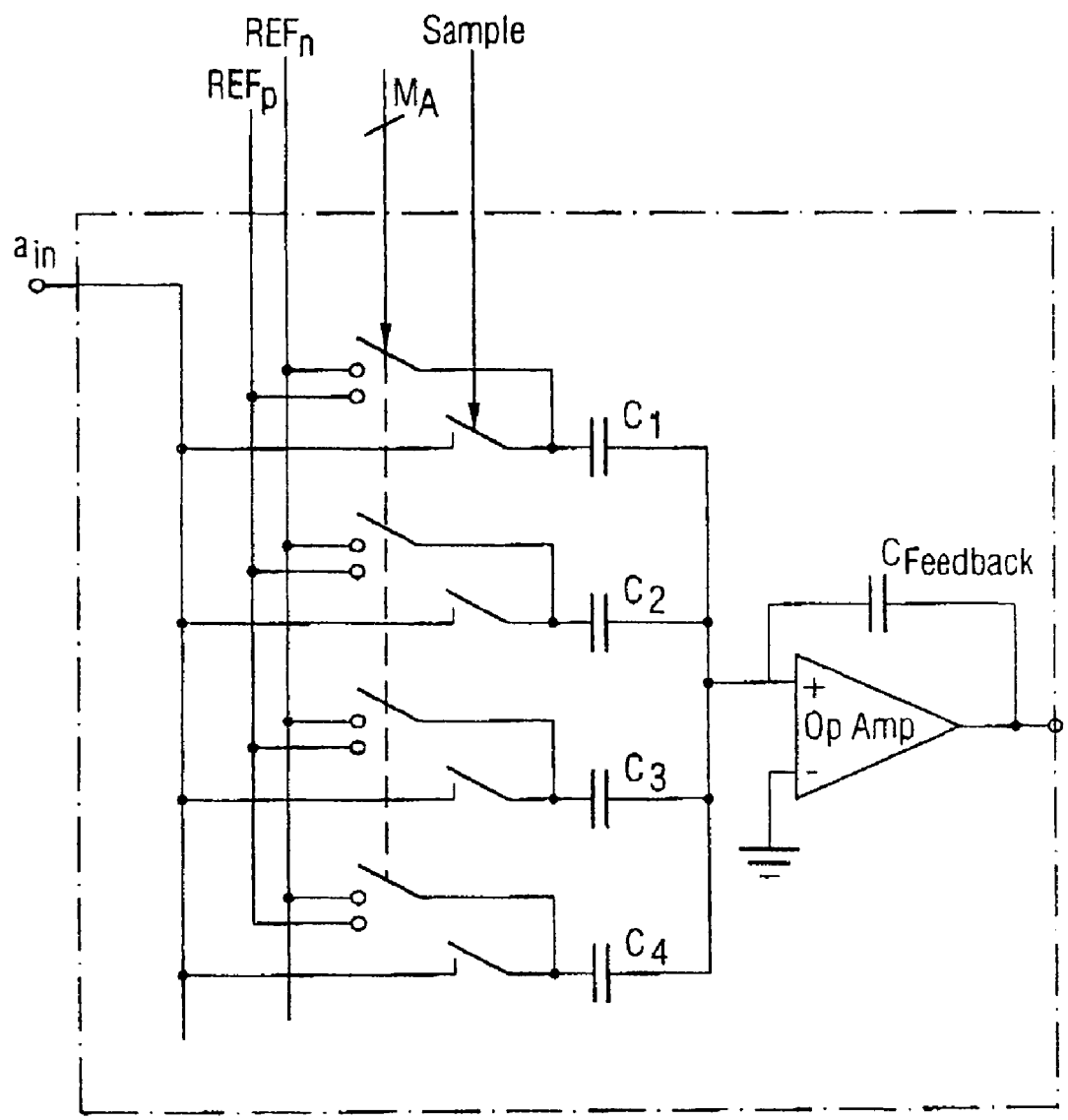
FIG. 3 shows a circuit implementation for a converter stage based on the prior art.

The inventive analog/digital converter 1 contains a random signal generator 19 which uses a line 20 to supply a calibration unit 21 with a random signal, preferably a digital random signal PSR. The circuitry of the calibration unit 21 has the design shown in FIG. 2. The digital random signal PSR generated by the random signal generator 19 is applied to the switch 8A in the first converter stage A via signal lines 22 and is fed into the signal path in the converter stage 8A via the switch 8A. The digital random signal PSR which has been fed in is sent via the digital/analog converter 13A and the subtractor 11A to the amplifier 17A in the first converter stage A, where it is amplified. The amplified digital random signal is output to the next converter stage B and is tapped off in the further signal path in the analog/digital converter 1. In the example shown in FIG. 6, the amplified digital random signal is tapped off at the output of the comparator 5B in the next converter stage B via a line 23 and is supplied to the calibration unit 21 for evaluation. The evaluation unit contained in the calibration unit 21 correlates the random signal which is fed into the signal path and is amplified by the converter stage A with the random signal amplified by the calibration amplifier in the calibration unit, in order to generate a setting signal for setting the calibration gain factor, until the output signal from the evaluation or correlation unit changes to zero and the calculated or set calibration gain factor corresponds to the gain V which is brought about by the digital/analog converter 13A and the signal amplifier 17A in the converter stage A.

The calibration unit 21 uses control lines 24 to actuate switch 8A in the converter stage A. To this end, the calibration unit 21 preferably contains a flow controller. The control signal is taken as a basis for switching the switches in the switching device 8A. In this context, the digital random signal PSR is first fed into the signal path by means of a switch via a calibration capacitor $C_{cal}$ within the digital/analog converter 13A in the converter stage A. Next, the digital random signal PSR is successively connected to the further DAC capacitors ($C_j$) within the digital/analog converter 13A on the basis of the control signals in order to calculate the respective signal gains of the DAC stages in the digital/analog converter.

Figure 5:
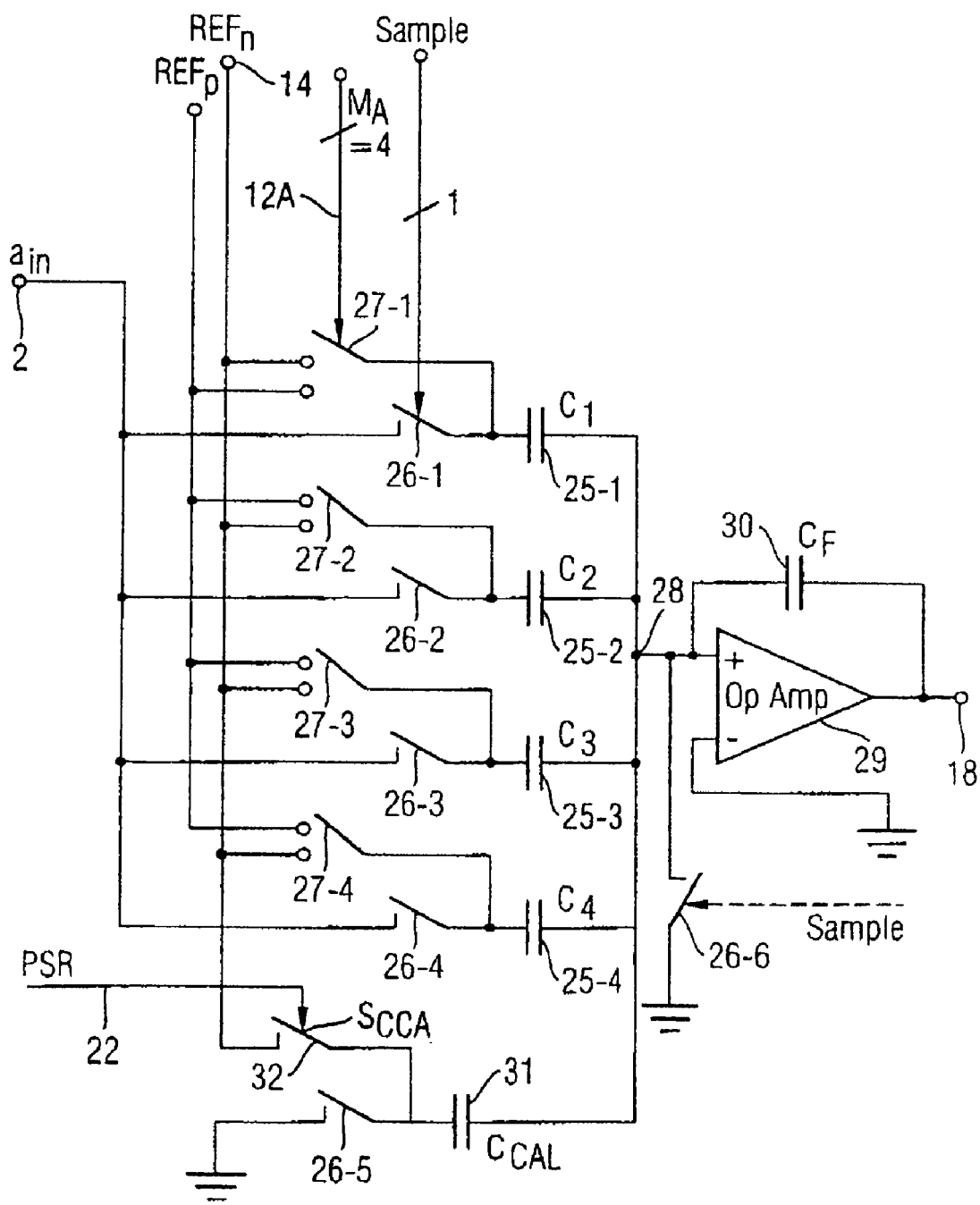
FIG. 5 shows a preferred embodiment of a circuit implementation for a converter stage in the inventive analog/digital converter.

FIG. 5 shows a circuit implementation for the first converter stage A in line with the invention.

FIG. 5 shows a single-ended implementation for a two-bit digital/analog converter with four DAC capacitors 25-1, 25-2, 25-3, 25-4. The DAC capacitors 25 can be connected to the analog input signal $a_{in}$ via controllable switches 26$i$. The switches 26$i$ are actuated by means of a sample control signal coming from a central flow controller. During the sample phase, the analog input signal $a_{in}$ is applied to the DAC capacitors 25, i.e. the switches 26$_i$ are closed. In addition, the DAC capacitors 25 can be connected to analog reference voltages $REF_P$, $REF_N$ via controllable switches 27. The switches 27 are actuated by the digital output value which is output by the comparator unit 5. The output value is preferably thermometer-coded. The DAC capacitors 25 are connected to a subtraction 28. The subtraction node 28 has an operational amplifier 29 connected downstream of it which has a feedback capacitor 30.

During the sample phase, the switches 26$i$ are closed, the switch 32 is open and the DAC capacitors 25 are connected to $a_{in}$ in the subsequent amplification phase, the switches 26$_i$ are open, the switch 32 is closed and the DAC capacitors 25 are connected to $REF_N$ or $REF_P$, depending on the decision in the comparator unit. For the gain $$V = \frac{\sum c_i}{C_F},$$

when $C_1 = C_2 = C_3 = C_4$ and $C_F = 2C$;

the result is $V = 2$, for example.

The dynamic range, i.e. the ratio of the amplitude of the output signal to the maximum amplitude, is 50%. The redundancy which exists is utilized to feed the digital random signal into the signal path.

By increasing the number of actuatable capacitors 25 and the associated increase in the number of comparators within the comparator unit 5A, a constant ratio for the capacitances of the DAC capacitors to the capacitance of the feedback capacitor ($\Sigma C_i/C_F$) increases the redundancy and reduces the dynamic range at the output of the converter stage. This prevents overloading. In this context, redundancy means that the number of comparators within the comparator unit 5A is greater than necessary.

Besides the DAC capacitors 25, the converter stage as shown in FIG. 5 has a calibration capacitor 31, in line with the invention. The calibration capacitor 31 can be connected to the reference voltage REF via a switch 32. The switch 32 is actuated by the digital random signal PSR supplied via the line 22. As a result, the digital random signal PSR is fed into the signal path in the analog/digital converter 1 via the calibration capacitor 31. There is a mismatch error between the various DAC capacitors 25-1 to 25-4 on account of manufacturing tolerances.

The signal gain of the converter stage shown in FIG. 5 is dependent on the ratio $$\frac{\sum C_i}{C_F}$$

and is corrupted by the nonideal op amp 29 and by the manufacturing tolerances of the capacitors 25. First, the signal gain CAL is calculated by the calibration unit 21 by virtue of the digital random signal PSR actuating the switch 32. The digital random signal PSR which is fed in is amplified in line with the ratio of the capacitance (CAL) of the calibration capacitor 31 and that of the feedback capacitor 30. In the next converter stage, the calibration signal which is fed in is branched off and is supplied to the calibration unit 21 via the line 23. The amplified random signal PSR is correlated with the amplified random signal contained in the calibration unit 21, and the calibration gain factor is adjusted until the calculated calibration gain factor corresponds to the gain in the signal path.

Next, the calibration unit 21 uses the control line 24 (not shown) to actuate switches such that the supplied digital random signal is connected to the various DAC capacitors 25-1 to 25-4 successively or randomly, or in any order. In the same way, the calibration unit 21 then calculates the various signal gains V1, V2, V3, V4. The five signal gains $V_{cal}$ ($C_{cal}$), V1 (C1), V2 (C2), V3 (C3), V4 (C4) calculated are buffer-stored in registers in the calibration unit 21. The calibration unit 21 then calculates a mean value V=(V1+V2+V3+V4):4 from the four buffer-stored signal gains V1, V2, V3, V4 of the DAC capacitors 25-1, 25-2, 25-3, 25-4 and outputs this ascertained gain factor as a multiplier to the weighting unit 9A in the first converter stage A via the line 33. In addition, the calibration unit 21 calculates the differences $\Delta V_{ij}$ between the buffer-stored signal gains V, which corresponds to the respective transfer errors between the different DAC stages. This DAC error also includes the insertion of the calibration capacitor 31.

The output values which are output by the converter stages and are weighted by the weighting unit 9 are summed by means of adders 34 and shift elements 35 to produce a digital output value from the analog/digital converter 1.

The DAC error calculated by the calibration unit 21 is supplied to a subtractor 37 via a line 36. The transfer error or DAC error calculated is deducted from the ascertained digital output value of the converter stages by the subtractor 37 in order to compensate for errors.

The calibration performed takes place continually in the background (background calibration) in the case of the inventive analog/digital converter 1. The inventive analog/digital converter 1 compensates both for signal gain errors and transfer errors or DAC errors. In this case, the errors are calculated digitally on a continuous basis. Complex trimming is no longer necessary. The drift in the ambient temperature and in the supply voltage is also compensated for continuously in this case. With the exception of the calibration capacitor 31 which is additionally required, the calibration can be implemented entirely digitally.

In the inventive calibration operation, the capacitance of a DAC capacitor and the associated gain of the DAC capacitor are determined by replacing this capacitance with the capacitance of the calibration capacitor. From the weight, it is possible to calculate the total gain and the level difference and to correct the calculated digital output value in the digital domain. The digital/analog converters 13 provided in the converter stages are preferably of fully differential design and have a high resolution. The resolution may be 4.5 bits, for example.

The calibration unit 21 shown in FIG. 4 may be provided separately for each converter stage. In one preferred embodiment, just one calibration unit 21 is provided which can be connected to the different converter stages by means of a multiplexer.

What is claimed is:

1. An analog to digital converter comprising:
    a sample and hold circuit operable to sample an input signal;
    a comparator unit operable to compare the input signal to a reference signal, and to provide a digital output value based upon the comparison;
    a digital to analog converter (DAC) including a calibration capacitor and a plurality of DAC capacitors, the DAC operably connected to the comparator unit to receive the digital output value, the DAC operable to convert the digital output value into an analog signal;
    a subtractor operably connected to receive the sampled input from the sample and hold circuit and the digital output value from the DAC, the subtractor operable to subtract the analog signal from the sampled input signal and to generate a remainder based thereon;
    an amplifier operably connected to receive the remainder from the subtractor and operable to output an amplified remainder based upon the remainder;
    a weighting unit operable to receive the digital output value from the comparator and operable to provide a weighted digital output value by multiplying the digital output with a received multiplier signal;
    a switch device operable to switch a received calibration signal to the calibration capacitor and further to each of the plurality of DAC capacitors; and
    a calibration unit operably connected to receive the calibration signal and the output of the amplifier and operable to control the switch device and to calculate the respective signal gains of each of the plurality of DAC capacitors in order to calculate information representative of a transfer error.

2. The analog to digital converter of claim 1, further comprising:
    a DAC error subtractor operable to receive the weighted digital output value from the weighting unit and the information representative of a transfer error from the calibration unit, the DAC error subtractor operable to subtract the information representative of a transfer error from the weighted digital output value.

3. The analog to digital converter of claim 1, wherein the calibration unit further comprises:
    a register operable to store the calculated signal gains of each of the plurality of DAC capacitors and the calibration capacitor.

4. The analog to digital converter of claim 3, wherein the calibration unit is further operable to calculate a mean value of the stored calculated signal gains of the plurality of DAC capacitors.

5. The analog to digital converter of claim 4, wherein the calibration unit is further operable to output the calculated mean value as the multiplier.

6. The analog to digital converter of claim 1, wherein the calibration unit comprises:
    an adjustable calibration amplifier operable to receive the calibration signal and to output the multiplier to the weighting unit and to output an amplified calibration signal, wherein the amplified calibration signal is equal to the calibration signal multiplied by the multiplier, and wherein the multiplier value is established in response to a setting signal;

a subtractor operable to receive the amplified remainder from the amplifier and the amplified calibration signal from the adjustable calibration amplifier, the subtractor operable to subtract the amplified remainder from the amplified calibration signal to output a difference signal; and an evaluation unit operable to receive the calibration signal and the difference signal, the evaluation unit operable to correlate the difference signal with the calibration signal to generate the setting signal.

7. The analog to digital converter of claim 6, wherein:
the calibration signal is a digital random signal; and
the evaluation unit is operable to cross-correlate the difference signal with the digital random signal to output the setting signal.

8. The analog to digital converter of claim 7, wherein the evaluation unit further comprises a filter operable to receive the setting signal and operable to filter the setting signal in order to output a filtered setting signal to the calibration amplifier.

9. The analog to digital converter of claim 1, wherein the calibration unit comprises:
a flow controller operable to generate control signals to control the switch device.

10. The analog to digital converter of claim 1, wherein the comparator unit is further operable to provide a thermometer coded digital output value.

11. The analog to digital converter of claim 1, wherein the sample and hold circuit, the comparator unit, the DAC, the subtractor, the amplifier, the weighting unit and the switch device are within a first converter stage, the analog to digital converter further comprising:
a second converter stage operable to receive the amplified remainder from the amplifier of the first converter stage.

12. The analog to digital converter of claim 1, wherein the calibration signal is a digital random signal generated by a random signal generator.

13. The analog to digital converter of claim 1, wherein the analog to digital converter is a fully differential analog to digital converter.

14. An analog to digital pipeline converter comprising:
a digital to analog converter (DAC) including a plurality of DAC capacitors and a calibration capacitor, the DAC operable to receive an analog signal; and
a switching device switchably connected to the plurality of DAC capacitors and the calibration capacitor, the switching device operable to switchably connect the output of a random signal generator to the calibration capacitor and further to each of the plurality of DAC capacitors, such that when a random signal from the random signal generator is applied to the calibration capacitor and further to each of the plurality of DAC capacitors, respectively, the output from the digital to analog converter is indicative of the gain of the calibration capacitor and further each of the plurality of DAC capacitors, respectively.

15. The analog to digital converter of claim 14, further comprising:
a sample and hold circuit with an output;
a subtractor operably connected to receive the output of the sample and hold circuit and the output of the digital to analog converter and operable to subtract the output of the digital to analog converter from the output of the sample and hold circuit in order to generate a remainder;
an amplifier operably connected to receive the remainder and operable to amplify the remainder to generate an amplified remainder; and
a calibration unit operable to receive the amplified remainder and to determine information representative of the gain of the calibration capacitor and further each of the plurality of DAC capacitors, respectively, when a random signal from the random signal generator is applied to the calibration capacitor and further to each of the plurality of DAC capacitors, respectively.

16. The analog to digital converter of claim 15, wherein the calibration unit is further operable to determine information representative of a mean value of the determined information representative of the gains of each of the plurality of DAC capacitors, the analog to digital converter further comprising:
a comparator operable to receive the analog signal and a reference signal, the comparator operable to compare the analog signal to the reference signal and to generate a digital output value based upon the comparison;
a weighting unit operable to receive the digital output value from the comparator and the information representative of the determined mean value from the calibration unit, and operable to multiply the digital output value with the information representative of determined mean value to generate a weighted digital output value based upon the multiplication.

17. The analog to digital converter of claim 16, wherein the calibration unit is further operable to determine information representative of the differences between the determined information representative of the gain of each of the plurality of DAC capacitors and the calibration capacitor to generate information representative of a DAC error, the analog to digital converter further comprising:
a digital output subtractor operably connected to receive the weighted digital output from the weighting unit and the information representative of the DAC error, and to subtract the information representative of the DAC error from the weighted digital output in order to generate a transfer error compensated digital output value based upon the subtraction.

18. The analog to digital converter of claim 15, wherein the calibration unit further comprises:
a flow controller operably connected to the switching device and operable to switchably connect the output of a random signal generator to the calibration capacitor and further to each of the plurality of DAC capacitors.

* * * * *